United States Patent [19]

Lien et al.

[11] Patent Number: 4,933,574
[45] Date of Patent: Jun. 12, 1990

[54] BICMOS OUTPUT DRIVER

[75] Inventors: Chuen-Der Lien, Mountain View; Wingyu Leung, Cupertino, both of Calif.

[73] Assignee: Integrated Device Technology, Inc., Santa Clara, Calif.

[21] Appl. No.: 303,855

[22] Filed: Jan. 30, 1989

[51] Int. Cl.$^5$ ............................................. H03K 19/01
[52] U.S. Cl. ................................... 307/446; 307/270; 307/473; 307/264; 307/570; 307/443
[58] Field of Search .................... 307/443, 264, 542.1, 307/446, 570, 473, 270

[56] References Cited

U.S. PATENT DOCUMENTS

| | | | |
|---|---|---|---|
| 4,707,623 | 11/1987 | Bismark | 307/443 |
| 4,769,561 | 9/1988 | Iwamura et al. | 307/446 |
| 4,779,014 | 10/1988 | Masuoka et al. | 307/570 |
| 4,785,203 | 11/1983 | Nakamura | 307/443 |

Primary Examiner—Timothy P. Callahan
Attorney, Agent, or Firm—Thomas E. Schatzel

[57] ABSTRACT

A bipolar transistor and two field-effect transistors are connected in a BiCMOS pull-down configuration to pull-down to a (first) predetermined potential level the potential developed on an output line when a high logic level potential is developed on an input line. To maximize switching speed and to minimize ground bounce (transients), the bipolar transistor is not permitted to go into saturation. A pair of transistors, connected in an inverter configuration, develop a signal which indicates when the bipolar transistor pulls-down the level of the potential on the output line below a (second) predetermined potential level. From a signal developed from the input line signal and a signal developed from the inverter developed signal, a gate develops a signal which drives a transistor that pulls-down from the (first) predetermined potential level to a low logic level potential the output line potential three gate delay times after the output line potential level falls below the (second) predetermined potential level.

9 Claims, 2 Drawing Sheets

BICMOS OUTPUT DRIVER

TECHNICAL FIELD

The present invention relates to integrated circuit devices generally and more particularly to an output driver having improved transient suppression.

BACKGROUND ART

A transient (spike or bounce) problem has been associated with certain high speed, high drive, CMOS, integrated circuit type output drivers (buffers). More specifically, when the state of an output driver is switched, transients are developed across stray inductances in the driver ground (Vss) and power (Vcc) paths. These transients are coupled to the outputs of other output drivers which share the same ground and power paths.

For example, consider the pair of prior art type output drivers illustrated in FIG. 1 of the drawing generally designated by the numbers 10 (on the left side of the drawing) and 10' (on the right), respectively. Buffer 10 is shown to employ a P-channel, field-effect transistor (FET), which is designated 12 (in the center of the drawing), and an N-channel, field-effect transistor, designated 14. Transistors 12 and 14 are connected as a CMOS inverter in what is referred to herein as a (P-channel over N-channel) totem-pole configuration. More specifically, transistor 12 is configured in a CMOS, pull-up configuration in which the gate of the transistor (12) is coupled by a line 20 and a pair of inverters 22 and 24 to the output of a 2-input NAND gate 26. The inputs of gate 26 are connected, one to a line 28 to receive a driver 10 enabling signal and the other to a line 30 to receive a data input signal. The source of transistor 12 is connected to a line 40; and, the drain of the transistor (12) is connected to a line 50, upon which driver 10 develops a data output signal.

Transistor 14 is configured in a CMOS, pull-down configuration in which the gate of transistor 14 is coupled by a line 60 and another inverter 62 to the output of another 2input NAND gate 64. One of the inputs of gate 64 is coupled by still another inverter 66 to line 30; and, the other input of the gate is connected to line 28. The drain of transistor 14 is connected to line 50; and, the source of the transistor is connected to a line 70.

Output driver 10' is similar to output driver 10. (For clarity, in the drawing, corresponding parts are similarly numbered, the driver 10' part numbers additionally having a prime.)

The sources of transistors 12 and 12' are directly connected to receive a power supply potential (Vcc); and, the sources of transistors 14 and 14' are directly connected to receive a circuit ground potential (Vss). However, there are stray inductances associated with the connections, attributable, in part, to the chip metalization, to the wire bonding, and to the lead frame. (The stray inductances pose a particular problem with devices which are of the series that is commonly designated 7400 and which are packaged in dual inline packages (DIPs) in which the ground and power pins are located at the extreme ends of the package.)

For purposes of illustration, the stray inductances are represented by discrete inductors. Thus, in the drawing, line 40 is shown coupled by an inductor 80 (representing the stray inductances in the power path) to a line 82 to receive the power supply potential; and, line 70 is shown coupled by an inductor 84 (representing the stray inductances in the ground path) to a line 86 to receive the circuit ground potential.

The capacitive reactance of the output driver 10 load is represented in the drawing by a discrete capacitor 90 connected between lines 50 and 86.

In understanding the transient problem, first, assume that output driver 10 is in the state in which transistor 12 is "on" and transistor 14 is "off". In this state, a "high" logic level potential is developed on line 50 and across capacitor 90. Also, assume that output driver 10'is in the state in which transistor 12' is "off" and transistor 14' is "on" developing a "low" logic level potential on line 50'.

Next, assume that the state of output driver 10 is switched so as to turn transistor 12 "off" and transistor 14 "on". When transistor 14 is turned "on", the potential developed across capacitor 90 is coupled by transistor 14 across inductor 84. As a consequence, a transient (ground bounce) is developed across inductor 84 Since transistor 14' (of output driver 10') is "on", the transient is coupled by transistor 14' to line 50' (A similar transient is developed on line 50' when output driver 10+ is held in the state in which transistor 12' is "on" and transistor 14' is "off" while the state of output driver 10 is switched so as turn transistor 14 "off"0 and transistor 12 "on".)

The transient problem is primarily associated with high speed, high drive, CMOS, integrated circuit type output devices. With those devices of the 7400 series that are designated 74XXX, 74HXXX, 74SXXX, and 74LSXXX, the transient turns "off" the bipolar transistor equivalent of (FET) transistor 14' before the (bipolar) transistor couples an appreciable amount of the transient to the output of the output driver. Also, with those devices of the 7400 series that are designated 74HCXXX and 74HCTXXX, the equivalent of transistors 12 and 14 and their drivers are not strong enough to develop an appreciable transient level across the equivalent of inductors 80 and 84. However, as the transistor channel length is decreased (to less than two microns (one millionth of a meter)) and the transistor channel width is increased, a transient of appreciable level is developed across the equivalent of inductor 84 and coupled to the equivalent of line 50'. A transient having a rise time of less than one nanosecond and a level in excess of three volts has been observed across the equivalent of inductor 84 when seven of eight output drivers (of an octal driver) are simultaneously switched.

For additional information on the transient problem, the reader is directed to the U.S. Pat. No. 4,785,201 of Marcelo A. Martinez, the articles which appeared on pages 29 and 30 of the Aug. 7, 1986 issue and on pages 81 and 82 of the Sept. 18, 1986 issue of *Electronics* and which were cited in the patent, pages 709, 729 –730, and 744–745 of the *IEEE Journal of Solid-State Circuits*, vol. sc-22, no. 5, October, 1987, and pages 88–89 and 120–123 of the *Digest of Technical Papers* IEEE International Solid-State Circuits Conference, Feb. 17–18, 1988, 0193-6530/88/00000XXX$01.00.

DISCLOSURE OF THE INVENTION

It is therefore the primary object of the present invention to provide a high speed, high drive, integrated circuit type output driver having improved transient suppression.

Another object of the present invention is to provide a transient suppressed, high speed, high drive, integrated circuit type output driver compatible with the 7400 series devices (that are packaged in dual in-line packages in which the ground and power pins are located at the extreme ends of the package).

Another object of the present invention is to provide a simple, transient suppressed, high speed, high drive, integrated circuit type output driver.

Briefly, the presently preferred embodiment of a BiCMOS output driver in accordance with the present invention includes a transistor connected in a pull-up configuration to develop a high logic level potential on an output line (112) when a low logic level potential is externally developed on an input line (110). Also included is a bipolar transistor, which, with two other (field-effect) transistors are connected in a BiCMOS pull-down configuration to pull-down to a (first) predetermined potential level the potential developed on the output line when a high logic level potential is externally developed on the input line. A pair of transistors are included connected as a threshold detector in a (first) (totem-pole) inverter configuration to develop a high logic level potential when the level of the potential on the output line is pulled-down below a (second) predetermined potential level. Further, another pair of transistors are included connected in a (second) inverter configuration to develop a signal the level of which is the inverse of the level of the signal developed by the first inverter; and, still another pair of transistors are included connected in a (third) inverter configuration to develop a signal the level of which is the inverse of the level of the signal externally developed on the input line. The driver also includes three transistors connected in a NOR gate configuration to gate the second inverter developed signal with the third inverter developed signal, and a transistor connected in a pull-down configuration to pull-down from the (first) predetermined level to a low logic level the potential developed by the BiCMOS pull-down transistors on the output line when a signal developed by the NOR gate transistors has a high logic level.

These and other objects of the present invention will no doubt become apparent to those skilled in the art after having read the detailed description of the presently preferred embodiment of the present invention which is illustrated in the figures of the drawing.

BRIEF DESCRIPTION OF THE FIGURES IN THE DRAWING

BEST MODE FOR CARRYING OUT THE INVENTION

Figure 1:
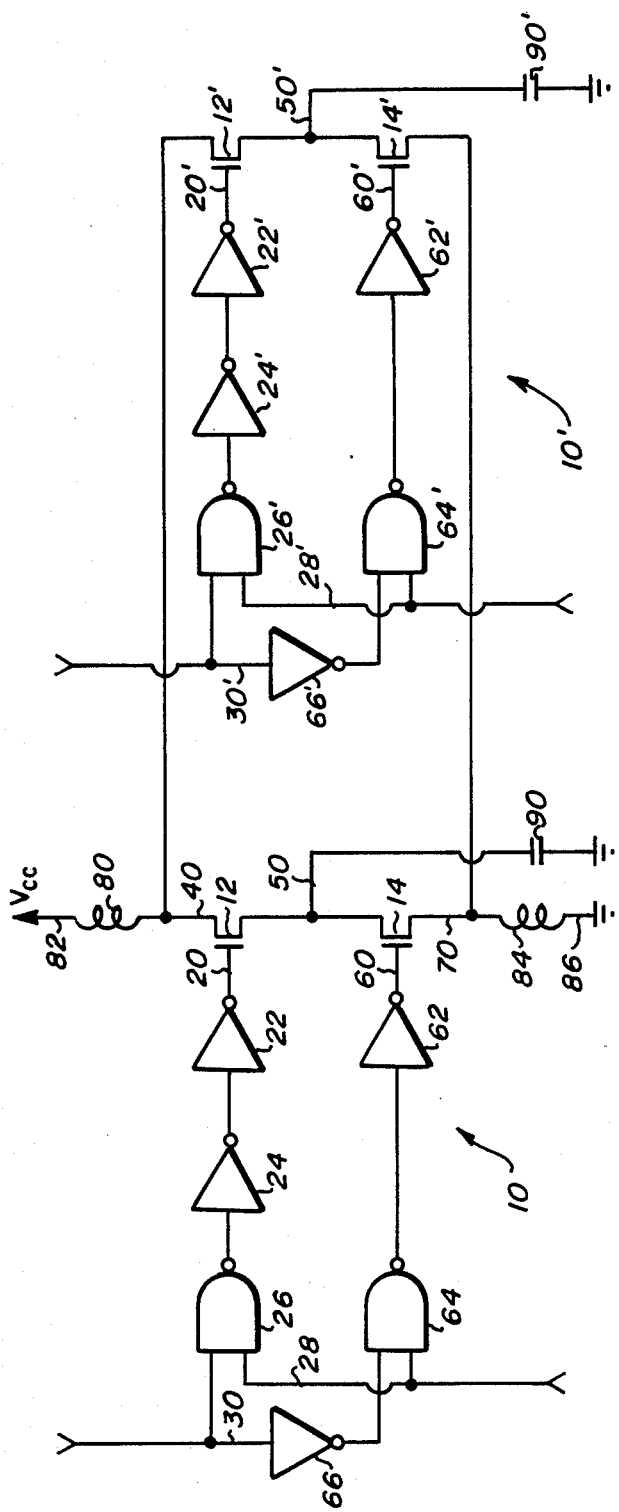
FIG. 1 is a schematic diagram of a pair of prior art type output drivers.
Figures 2, 3:
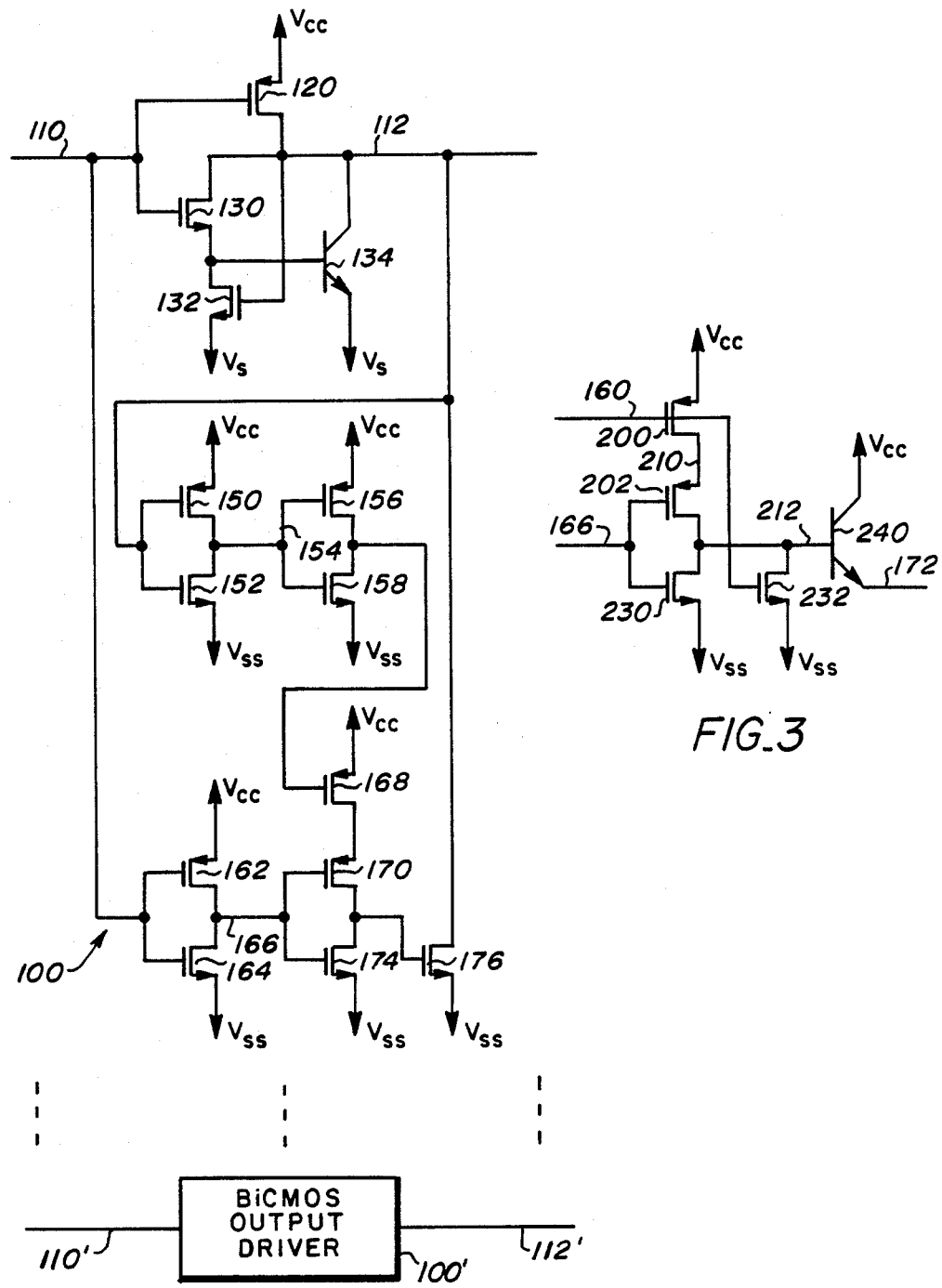
FIG. 2 is a schematic diagram of a BiCMOS output driver in accordance with the presently preferred embodiment of the present invention.
FIG. 3 is a schematic diagram of a BiCMOS NOR gate used in another embodiment of the BiCMOS output driver shown in FIG. 2.

Illustrated in FIG. 2 of the drawing generally designated by the number 100 is the presently preferred embodiment of a BiCMOS output driver in accordance with the present invention. Responsive to the logic level of a signal externally developed on a line, which is designated 110, driver 100 is operative to develop a signal of inverted logic level on a line, which is designated 112. To develop a high logic level potential on line 112, driver 100 is shown to include a P-channel (field-effect) transistor, which is designated 120, and which is configured in the CMOS pull-up configuration. More specifically, transistor 120 is configured with (an end of the transistor channel, referred to herein as) the transistor source connected to a power supply potential (Vcc), with the transistor gate connected to line 110, and with (an end of the transistor channel, referred to herein as) the transistor drain connected to line 112.

To pull-down to a predetermined level the level of the potential developed on line 112, driver 100 is shown to include a P-channel, field-effect, transistor, which is designated 130, another P-channel, field-effect, transistor, which is designated 132, and a bipolar, NPN transistor, which is designated 134, the combination configured in, what is referred to herein as, a bipolar-CMOS (BiCMOS) pull-down configuration. More specifically, transistor 130 is configured with the transistor drain connected to line 112, with the transistor gate connected to line 110, and with the transistor source connected to a line, which is designated 136. Transistor 132 is configured, with the transistor drain connected to line 136, with the transistor gate connected to line 112, and with the transistor source connected to a circuit ground potential (Vss). Finally, transistor 134 is configured, with the transistor base connected to line 136, with the transistor collector (or emitter) connected to line 112, and with the transistor emitter (or collector) connected to a circuit ground potential (Vss).

To pull-down from the predetermined level to a low logic level the potential developed on line 112, driver 100 is shown to include; a pair of transistors, which are designated 150 and 152, and which are connected as a threshold detector in the totem-pole inverter configuration between line 112 and a line 154; another pair of transistors, which are designated 156 and 158, and which are, also, connected in the totem-pole inverter configuration, in this case, between line 154 and a line 160; another pair of transistors, which are designated 162 and 164, which are, also, connected in the totem-pole inverter configuration, in this case, between line 110 and a line 166; a pair of transistors, designated 168 and 170, connected in, what is referred to herein as, a CMOS, NOR, pull-up configuration, to line 160, to line 166, and to a line 172; a transistor 174, connected in the pull-down configuration between line 166 and line 172; and a transistor 176, also connected in the pull-down configuration, in this case, between line 172 and line 112.

More specifically, transistors 150 and 152 are connected in the totem-pole configuration, with the gate of transistor 150 connected to line 112, with the source of transistor 150 connected to a power supply potential (Vcc), and with the drain of transistor 150 connected to line 154. Transistor 152 is configured, with the transistor gate connected to line 112, with the transistor drain connected connected to line 154, and with the transistor source connected to a circuit ground potential (Vss). Similarly, transistor 156 is configured, with the transistor gate connected to line 154, with the transistor source connected to a power supply potential (Vcc), and with the transistor drain connected to line 160. Transistor 158 is configured, with the transistor gate connected to line 154, with the transistor drain connected to line 160, and with the transistor source connected to a circuit ground potential (Vss). Further, transistor 162 is configured, with the transistor gate connected to line 110, with the transistor source connected to a power supply potential (Vcc), and with the transistor drain connected to line 166. Transistor 164 is configured, with the transistor gate connected to line 110, with the transistor drain connected to line 166, and with the transistor source connected to a circuit ground potential (Vss).

Transistors 168 and 170 are connected in the CMOS, NOR gate, pull-up configuration, with the gate of transistor 168 connected to line 160, with the source of transistor 168 connected to a power supply potential (Vcc), and with the drain of transistor 168 connected to a line 190. Transistor 170 is configured, with the transistor gate connected to line 166, with the transistor source connected to line 190, and with the transistor drain connected to line 172.

Transistor 174 is connected in the CMOS pull-down configuration, with the transistor gate connected to line 166, with the transistor source connected to a circuit ground potential (Vss), and with the transistor drain connected to line 172. Transistor 176 is also connected in the CMOS pull-down configured, with the transistor gate connected to line 172, with the transistor source connected to a circuit ground potential (Vss), and with the transistor drain connected to line 112.

In the presently preferred embodiment, the field-effect transistors have the following parameters:

| Transistor | Type | Threshold Voltage | Channel Width | Channel Length |
|---|---|---|---|---|
| 120 | P-Channel | −0.7 Volts | 1000 Microns | 1.1 Microns, |
| 130 | N-Channel | 0.7 Volts | 10 Microns | 0.8 Microns, |
| 132 | N-Channel | 0.7 Volts | 15 Microns | 0.8 Microns, |
| 150 | P-Channel | −0.7 Volts | 15 Microns | 0.9 Microns, |
| 152 | N-Channel | 0.7 Volts | 60 Microns | 0.8 Microns, |
| 156 | P-Channel | −0.7 Volts | 20 Microns | 0.9 Microns, |
| 158 | N-Channel | 0.7 Volts | 20 Microns | 0.8 Microns, |
| 162 | P-Channel | −0.7 Volts | 60 Microns | 0.9 Microns, |
| 164 | N-Channel | 0.7 Volts | 20 Microns | 0.8 Microns, |
| 168 | P-Channel | −0.7 Volts | 60 Microns | 0.9 Microns, |
| 170 | P-Channel | −0.7 Volts | 60 Microns | 0.9 Microns, |
| 174 | N-Channel | 0.7 Volts | 80 Microns | 0.8 Microns, and |
| 176 | N-Channel | 0.7 Volts | 1000 Microns | 1.0 Microns. |

In the presently preferred embodiment, bipolar transistor 134 has the following parameters:

| Transistor | Type | ft | Emitter Width | Emitter Length |
|---|---|---|---|---|
| 134 | NPN | 6 GHz | 2.0 Microns | 7.5 Microns. |

Output driver systems in accordance with the present invention employ eight, similar, BiCMOS output drivers, all integrated into a single device. In FIG. 2, the other BiCMOS output drivers are represented by an output driver 100'.

Operationally, responsive to a low logic level potential externally developed on line 110, transistor 120 develops a high logic level potential on line 112.

Responsive to a high logic level potential externally developed on line 110, transistors 130, 132, and 134 pull-down to a (first) predetermined level the potential developed on line 112. (The (first) predetermined potential level to which transistor 134 pulls-down the potential developed on line 112 is established by the transistor 132 threshold voltage.) It is important to note that, to maximize switching speed and to minimize ground bounce (transients), transistor 134 is not permitted to go into saturation.

When the level of the potential developed on line 112 falls below another (second) predetermined level (established by the threshold voltage of transistor 150), transistors 150 and 152 develop a high logic level potential on line 154. Responsive thereto, transistors 156 and 158 develop a low logic level potential on line 160.

Meanwhile, responsive to the high logic level potential externally developed on line 110, transistors 162 and 164 develop a low logic level potential on line 166, turning on transistor 170. However, until transistor 168 is turned on, transistors 168, 170, and 174 do not develop a high logic level potential on line 172. Transistor 168 is not turned on until two (2) gate delay times (the delay attributable to transistors 150 and 152 plus the delay attributable to transistors 156 and 158) after the potential level developed on line 112 falls below the (second) predetermined level. Finally, responsive to a high logic level potential developed by transistors 168, 170, and 174 on line 172, transistor 176 pulls-down the level of the potential developed on line 112 from the (first) predetermined potential level to a low logic level.

In another embodiment, transistor 174 is replaced by three transistors connected in a BiCMOS pull-down configuration similar to that of transistors 130, 132, and 134. Also, transistors 168 and 170 are replaced by five transistors connected in a BiCMOS, NOR gate, pull-up configuration, which is illustrated in FIG. 3. Two transistors, designated 200 and 202, are connected in the CMOS, NOR gate, pull-up configuration, with the gate of transistor 200 connected to line 160, with the source of the transistor connected to a power supply potential (Vcc), and with the drain of the transistor connected to a line 210. Transistor 202 is configured, with the transistor gate connected to line 166, with the transistor source connected to line 210, and with the transistor drain connected to a line 212.

Two transistors, designated 230 and 232, are each connected in the CMOS pull-down configuration. Transistor 230 is connected, with the transistor gate connected to line 166, with the transistor source connected to a circuit ground potential (Vss), and with the transistor drain connected to line 212. Transistor 232 is configured, with the transistor gate connected to line 160, with the transistor source connected to a circuit ground potential (Vss), and with the transistor drain, also, connected to line 212.

Finally a bipolar, NPN transistor, which is designated 40, is included. Transistor 240 is configured, with the transistor base connected to line 160, with the transistor collector connected to a power supply potential (Vcc), and with the transistor emitter connected to line 172.

It is contemplated that after having read the preceding disclosure, certain alterations and modifications of the present invention will no doubt become apparent to those skilled in the art. It is therefor intended that the following claims be interpreted to cover all such alterations and modifications as fall within the true spirit and scope of the invention.

What is claimed is:

1. A bipolar-CMOS output driver comprising in combination:
   an input line;
   an output line;
   pull-up means for pulling-up to a high logic potential level the level of a potential developed on said output line;
   first, BiCmos, pull-down means for pulling-down to a first predetermined potential level the level of said output line potential level when a high logic potential level is developed on said input line, said first pull-down means including,
a first, field-effect, transistor having drain means connected to said output line, a gate connected to said input line, and source means;
a second, bipolar, transistor having a base connected to said first pull-down means first transistor source means, collector means connected to said output line, and emitter means connected to receive a first power supply potential;
a third, field-effect, transistor having drain means connected to said first pull-down means first transistor source means, a gate connected to said output line, source means connected to said first pull-down means second transistor emitter means, and a predetermined threshold voltage level of such magnitude that said first pull-down means third transistor prevents said first pull-down means second transistor from developing on said output line a potential level less than said first predetermined potential level and prevents said first pull-down means second transistor from going into saturation; and
second pull-down means connected to said input and said output lines, said second pull-down means for pulling-down from said first predetermined potential level to a low logic potential level said output line potential level when both said high logic potential level is developed on said input line and said output line potential level is less than a second predetermined potential level.

2. A bipolar-CMOS output driver as recited in claim 1 wherein said second pull-down means includes,
first threshold detector means having an input connected to said output line and an output, said first threshold detector means for developing at said first threshold detector means output a signal the state of which indicates when said output line potential level is less than said second predetermined potential level,
first gate means having a first input coupled to said first threshold detector means output, a second input, and an output, and
third pull-down means having an input connected to said first gate means output and an output connected to said output line.

3. A bi-polar-CMOS output driver as recited in claim 2 wherein said third pull-down means includes a transistor having a gate connected to said first gate means output, drain means connected to said output line, and source means connected to said said first pull-down means second transistor emitter means.

4. A bipolar-CMOS output driver as recited in claim 3 wherein said first threshold detector means employs,
second threshold detector means having first inverter means including,
a first transistor having a gate connected to said output line, source means connected to receive a second power supply potential, and drain means, and
a second transistor having a gate connected to said first inverter means first transistor gate, drain means connected to said first inverter means first transistor drain means, and source means connected to said first pull-down means second transistor emitter means, and
second inverter means having an input connected to said first inverter means first transistor drain means and an output connected to said first gate means first input.

5. A bipolar-CMOS output driver as recited in claim 4 wherein said second inverter means includes,
a first transistor having a gate connected to said first inverter means first transistor drain means, source means connected to said first inverter means first transistor source means, and drain means connected to said first gate means first input, and
a second transistor having a gate connected to said said second inverter means first transistor gate, drain means connected to said said second inverter means first transistor drain means, and source means connected to said first pulldown means second transistor emitter means.

6. A bipolar-CMOS output driver as recited in claim 5 wherein said first gate means employs,
third inverter means including,
a first transistor having a gate connected to said input line, source means connected to said first inverter means first transistor source means, and drain means, and
a second transistor having a gate connected to said said third inverter means first transistor gate, drain means connected to said said third inverter means first transistor drain means, and source means connected to said first pull-down means second transistor emitter means, and
second gate means having a first input connected to said said second inverter means first transistor drain means, a second input connected to said said third inverter means first transistor drain means, and an output connected to said third pull-down means transistor gate.

7. A bipolar-CMOS output driver as recited in claim 6 wherein said second gate means includes,
a first transistor having a gate connected to said said second inverter means first transistor drain means, source means connected to said first inverter first means transistor source means, and drain means,
a second transistor having a gate connected to said said third inverter means first transistor drain means, source means connected to said said second gate means first transistor drain means, and drain means connected to said third pull-down means transistor gate,
a third transistor having a gate connected to said second gate means second transistor gate, drain means connected to said second gate means second transistor drain means, and source means connected to said second pulldown means second transistor emitter means.

8. A bipolar-CMOS output driver as recited in claim 7 wherein said pull-up means including a transistor having a gate connected to said input line, source means connected to said first inverter means first transistor source means, and drain means connected to said output line.

9. A bipolar-CMOS output system comprising in combination: at least two output drivers each of which includes,
an input line;
an output line;
pull-up means for pulling-up to a high logic potential level the level of a potential developed on said output lines;
first, BiCmos, pull-down means for pulling-down to a first predetermined potential level the level of said output line potential level when a high logic potential level is developed on said input line, said first pull-down means including,
- a first, field-effect, transistor having drain means connected to said output line, a gate connected to said input line, and source means;
- a second, bipolar, transistor having a base connected to said first pull-down means first transistor source means, collector means connected to said output line, and emitter means connected to receive a first power supply potential;
- a third, field-effect, transistor having drain means connected to said first pull-down means first transistor source means, a gate connected to said output line, source means connected to said first pull-down means second transistor emitter means, and a predetermined threshold voltage level of such magnitude that said third transistor prevents said second transistor from developing on said output line a potential level less than said first predetermined potential level and prevents said second transistor from going into saturation; and second pull-down means connected to said input and said output lines, said second pull-down means for pulling-down from said first predetermined potential level to a low logic potential level said output line potential level when both said high logic potential level is developed on said input line and said output line potential level is less than a second predetermined potential level.

* * * * *